United States Patent [19]
Cockey, IV

[11] Patent Number: 5,296,822
[45] Date of Patent: Mar. 22, 1994

[54] LOW PASS FILTER CIRCUIT DEVICE AND METHOD HAVING SELECTABLE CUTOFF FREQUENCY

[75] Inventor: Edward A. Cockey, IV, Jarrettsville, Md.

[73] Assignee: Westinghouse Electric Corp., Pittsburgh, Pa.

[21] Appl. No.: 999,754

[22] Filed: Dec. 31, 1992

[51] Int. Cl.$^5$ ............................................. H03F 3/04
[52] U.S. Cl. .................................. 330/306; 333/173; 307/520
[58] Field of Search ...................... 333/173, 174, 168; 307/520, 521; 330/306, 107, 302, 303, 305; 328/167

[56] References Cited
FOREIGN PATENT DOCUMENTS 0155709 6/1989 Japan .................................. 333/173

Primary Examiner—Robert J. Pascal
Assistant Examiner—James Dudek
Attorney, Agent, or Firm—Craig N. Killen

[57] ABSTRACT

A device and method is provided for filtering frequency components of an electrical signal above a selectable low pass cutoff frequency which is changeable within a designated range. An input filter having a fixed low pass cutoff frequency provides aliasing protection for a first of at least three clock driven filter stages respectively having variable low pass cutoff frequencies proportional to a clock rate of a received clock signal. The overall selectable low pass filter is determined at an intermediate stage of the clock driven filter stages. Clock rates of respective clock signals applied to clock driven stages proceeding the intermediate stage having the selectable cutoff frequency are adjusted so that each provides aliasing protection for the next. Similarly, the low pass cutoff frequencies of clock driven filter stage succeeding the intermediate stage having the selectable cutoff frequency are adjusted to eliminate staircasing distortion in the output signal. The filtered signal is then preferably passed through a fixed output filter to eliminate any frequency components at the clock rate of the last clock driven filter stage.

9 Claims, 1 Drawing Sheet

LOW PASS FILTER CIRCUIT DEVICE AND METHOD HAVING SELECTABLE CUTOFF FREQUENCY

BACKGROUND OF THE INVENTION

1. Field of the Invention

The present invention relates to electrical signal filters having user selectable filter characteristics. More particularly, the invention relates to a device and method of providing an electrical signal filter having a low pass cutoff frequency changeable over a wide range.

2. Description of the Prior Art

It is often desirable in various signal conditioning applications to utilize a low pass filter having a changeable cutoff frequency. Particularly useful in such applications are clock driven filters, such as certain switched capacitor filters, in which the cutoff frequency is determined by the clock rate. A typical clock driven filter, however, will "reflect" all frequency components greater than the Nyguist frequency (one-half the clock rate) into the frequency range below one-half the clock rate. This phenomenon is referred interchangeably in the art as aliasing or "folding" error.

To prevent this error, frequency components above the Nyguist frequency must be attenuated before being applied to the input of the filter. For example, a typical clock driven filter having a clock rate of one hundred times the low pass cutoff frequency will have a Nyguist frequency of fifty times the cutoff frequency. Generally, these higher frequencies are eliminated utilizing a non-switching operational-amplifier-based low pass filter at the input of the clock driven filter having a fixed cutoff frequency slightly greater than the highest predicted cutoff frequency at which the clock driven filter will be operated. If, however, the clock driven filter must have a cutoff frequency variable over a wide range which brings the Nyguist frequency close to the cutoff frequency of the fixed input filter, aliasing can occur since high frequency components will not be sufficiently attenuated.

Another problem with such clock driven filters is that the output is not a smooth signal but is a "staircased" output due to the switched nature of the device. This unwanted clock feedthrough not only distorts the output signal but can also cause aliasing if the output is itself sampled by other processing circuitry. The usual solution to this clock feedthrough is the use of a fixed low pass filter on the output. Such a filter, however, often fails to sufficiently attenuate these clock frequencies as the cutoff frequency of the clock driven filter approaches the lowest frequencies in its adjustable range.

SUMMARY OF THE INVENTION

The present invention provides a device and method for filtering frequency components of an electrical signal above a selectable low pass cutoff frequency which is changeable within a designated range. The device may be utilized in situations requiring dynamic changing of the cutoff frequency as well as allowing a standard unit to be employed in a multitude of applications. Aliasing and feedthrough problems inherent in the prior art are quelled by fixing the selectable low pass cutoff frequency at an intermediate stage of at least three serially coupled clock driven filter stages.

An input filter having a fixed low pass cutoff frequency provides aliasing protection for the first clock driven filter stage. Clock rates of respective clock signals applied to the clock driven stages proceeding the intermediate stage having the selectable cutoff frequency are adjusted so that each provides aliasing protection for the next. Similarly, the low pass cutoff frequencies of clock driven filter stages succeeding the intermediate stage having the selectable cutoff frequency are adjusted to eliminate staircasing distortion in the output signal. The filtered signal is then preferably passed through a fixed output filter to eliminate any frequency components at the clock rate of the last clock driven filter stage.

As the number of clock driven filter stages is increased, the designated range over which the selectable low pass cutoff frequency may be changed is broadened considerably. The clock signals for the clock driven filter stages may all be derived from a single clock source utilizing fixed frequency dividers or may be generated by individual clock generators for even greater flexibility in cutoff range and attenuation. Where an odd number of clock driven filter stages is utilized, the same clock signal may be applied to complimentary stages preceding and succeeding the intermediate stage having the selectable low pass cutoff frequency.

DETAILED DESCRIPTION OF PRESENTLY PREFERRED EMBODIMENTS

In accordance with the invention, an electrical signal filter device and method may be provided utilizing a plurality of serially coupled clock driven filter stages to give a selectable low pass cutoff frequency range of several decades or more. The need for higher order and multiple frequency fixed front end filters typically required by the prior art is eliminated.

Figure 1:
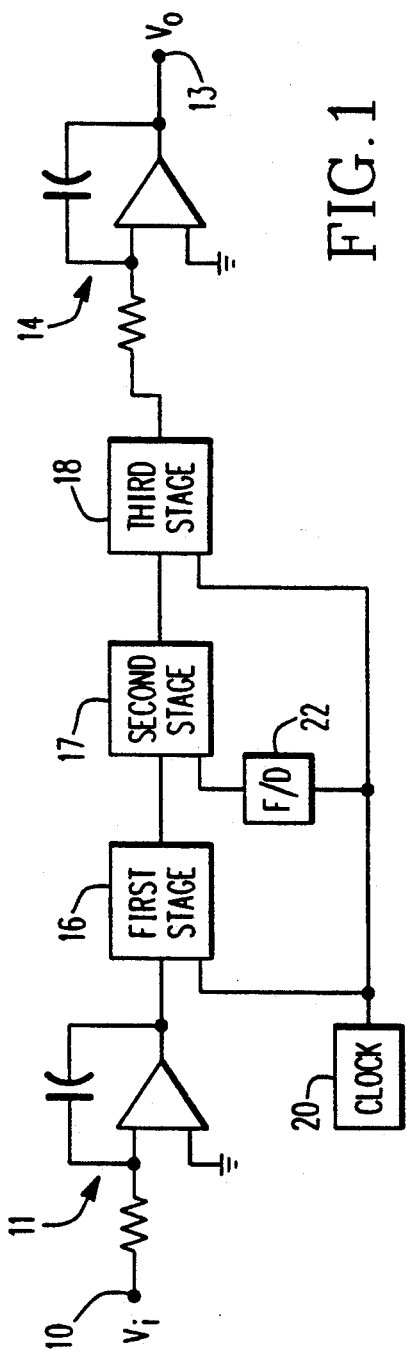
FIG. 1 is a diagrammatic illustration of a presently preferred embodiment of the invention utilizing three clock driven filter stages operated by a single clock source.

Referring particularly to FIG. 1, electrical signals $V_i$ to be filtered are received at input node 10 of a simple single pole input filter 11. The output of filter 11 is then passed through successive clock driven filter stages before being delivered as output signal $V_0$ to output node 13 of single-pole output filter 14. Filters 11 and 14 may be easily constructed as operational amplifier integrators as illustrated. Stages 16, 17 and 18 are preferably switched capacitor filters implemented on integrated circuit chips. Six pole low pass Butterworth filter chips have been found suitable for this purpose, but other chips implementing alternative filters such as Chebyshev may be substituted.

The respective low pass cutoff frequencies of stages 16, 17 and 18 are variable, being determined by the clock rate of a particular clock signal applied at each. Filter 11 will function to provide aliasing protection to stage 16, which in turn provides aliasing protection to stage 17. Stage 18 reduces staircasing distortion by eliminating frequency components in the output of stage 18 due to switching, while output filter 14 likewise eliminates switching components appearing in the output of stage 18.

Consider for illustrative purposes only the following exemplar in which specific frequency values are given. Switched capacitor filters such as stages 16, 17 and 18 typically are specified as having a variable low pass cutoff frequency equal to 1/100th of the applied clock rate. If the maximum low pass cutoff frequency desired is 2000 Hz, input filter 11 may be designed to have a fixed low pass cutoff frequency of approximately 8000 Hz. The variable low pass cutoff frequency of stage 16 could then be programmed by the application of an appropriate clock signal from the 2000 Hz upper limit frequency down to a frequency of approximately 160 Hz. Thus, the Nyguist frequency of the clock signal applied to stage 16 will not drop below the fixed cutoff frequency of input filter 11. As a result, aliasing is inhibited. Similarly, stage 16 provides aliasing protection for stage 17, which may be programmed to have a variable cutoff frequency from the 2000 Hz upper limit frequency to approximately 1/12th the cutoff frequency of stage 16. This combination thereby facilitates a frequency range of greater than 140 times. By adding more stages, each with a progressively lower clock frequency for each stage, this range can be increased.

It can be seen that the selectable low pass cutoff frequency of the overall device is effectively determined at stage 17. The output of this stage, however, will have staircasing distortion at its clock rate. Since this clock rate may, at the lowest selectable low pass cutoff frequencies, actually be lower than the upper limit frequency of the designated range, a fixed cutoff frequency filter immediately after stage 17 would limit flexibility. By adding additional clock driven stages after stage 17, however, the distortion caused by staircasing can be eliminated without detrimentally affecting the selectable frequency bandwidth. In this embodiment, the output of stage 17 is passed to a single succeeding stage 18 which maintains a variable cutoff frequency below the clock rate of stage 17. The output of stage 18 will too have frequency components at its own clock rate which could cause aliasing if, for example, the signal $V_0$ were sampled downstream for further processing. These frequency components, however, are well above the upper limit frequency of the designated range and are easily removed by output filter 14.

For greatest flexibility, the clock signals applied to stages 16, 17 and 18 may be supplied by a plurality of clock sources. However, simplicity of design and assurance that the cutoff frequencies of the respective stages are maintained in a proper relationship are often facilitated by a single clock source. An example of the utilization of a single clock source is illustrated in FIG. 1 in which clock signals generated by clock 20 are directly applied to stages 16 and 18. A frequency divider circuit ("F/D") 22 is provided to receive this clock signal and lower its clock rate by a preselected ratio before application to stage 17.

Figure 2:
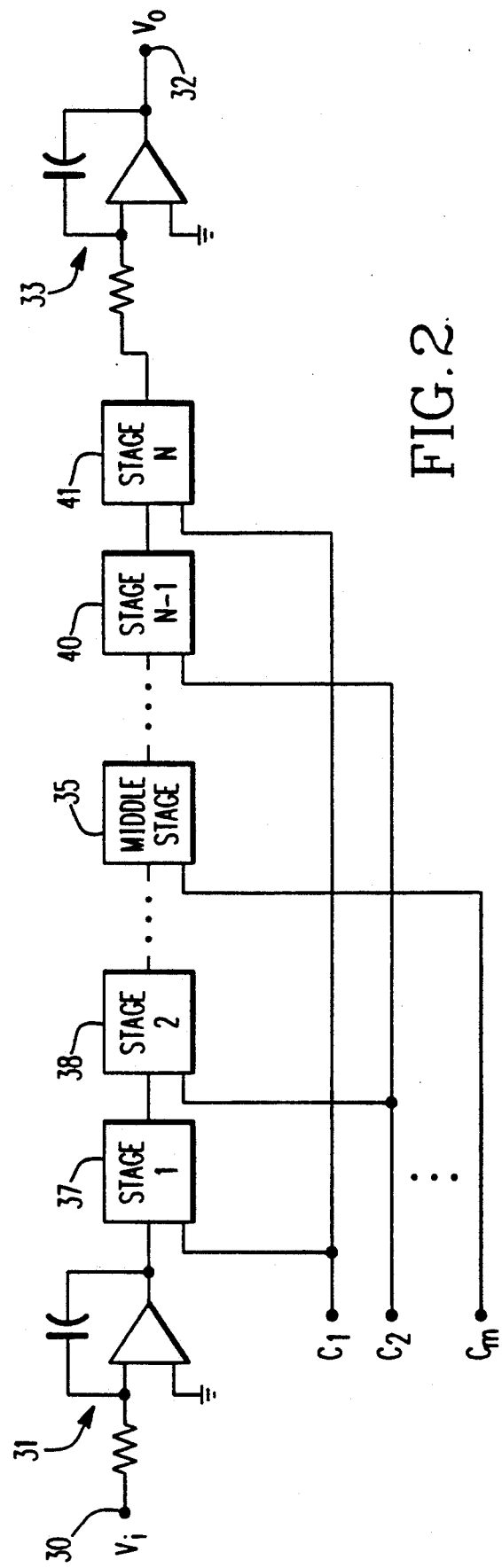
FIG. 2 is a diagrammatic illustration of a presently preferred embodiment of the invention utilizing N clock driven filter stages operated by a plurality of clock sources.

Referring to FIG. 2, an electrical signal filter device is illustrated having a very wide range over which the selectable low pass cutoff frequency may be varied. As with the embodiment illustrated in FIG. 1, electrical signals $V_i$ to be filtered are received at input node 30 of fixed input filter 31. Similarly, output signals $V_0$ are delivered at output node 32 of fixed output filter 33. In this embodiment, a multiplicity of N clock driven filter stages are provided interposing filters 31 and 33, where N is an integer. The overall selectable low pass cutoff frequency of the device is eventually determined at an intermediate stage 35, which may be the middle stage where N is odd. Stages, such as stages 37 and 38, preceding middle stage 35 are generally clocked to have sequentially decreasing variable low pass cutoff frequencies in order to prevent aliasing. Filter stages, such as stages 40 and 41, succeeding stage 35 are similarly clocked to have sequentially increasing low pass cutoff frequencies. As a result, staircasing distortion of the output signal is eliminated.

The various clock signals required to achieve the respective variable cutoff frequencies may be applied to complementary stages about middle stage 35 as shown. Thus, for example, the first stage 37 and the Nth stage 41 would share the same clock signal $C_1$. Likewise, the second stage 38 and the N-1 stage 40 would share the same clock signal $C_2$. Middle stage 35 would be driven by a unique clock signal $C_m$.

It can thus be seen that the invention provides an electrical signal filter device and method which has a selectable low pass cutoff frequency changeable over a wider range than the prior art. As a result, the invention provides flexibility to a degree which has previously been unattainable. While certain presently preferred embodiments of the invention and presently preferred methods of practicing the same have been shown and described, it is to be distinctly understood that the invention is not limited thereto but may be otherwise variously embodied and practiced within the scope of the following claims.

I claim:

1. An electrical signal filter device having a selectable low pass cutoff frequency changeable within a designated range, said device comprising:

an input filter having an input node electrically connectable to receive input signals to be filtered, said input filter having a first fixed low pass cutoff frequency greater than an upper limit frequency of said designated range;

an output filter having an output node electrically connectable to deliver filtered output signals, said output filter having a second fixed low pass cutoff frequency greater than said upper limit frequency of said designated range;

at least three serially coupled clock driven filter stages electrically connected interposing said input filter and said output filter, each of said clock driven filter stages having a variable low pass cutoff frequency proportional to a clock rate of a respective clock signal applied thereto;

a first stage of said clock driven filter stages having a first variable low pass cutoff frequency no greater than said upper limit frequency of said designated range;

a second stage of said clock driven filter stages having a second variable low pass cutoff frequency no greater than said first variable low pass cutoff frequency and equal to said selectable low pass cutoff frequency;

a third stage of said clock driven filter stages having a third variable low pass cutoff frequency no less than said second variable low pass cutoff frequency and no greater than said second fixed low pass cutoff frequency; and, clock means for providing respective clock signals to said clock driven filter stages such that effective filtering of frequencies greater than said selectable low pass cutoff frequency is facilitated.

2. The electrical signal filter device of claim 1 wherein said at least serially coupled three clock driven filter stages comprises a plurality of N serially coupled clock driven filter stages, where N is an odd integer.

3. The electrical signal filter device of claim 2 wherein said variable low pass cutoff frequency of a middle stage of said N serially coupled clock driven filter stages is equal to said selectable low pass cutoff frequency.

4. The electrical signal filter device of claim 3 wherein stages of said N serially coupled clock driven filter stages preceding said middle stage have sequentially decreasing variable low pass cutoff frequencies and stages of said N serially coupled clock driven filter stages succeeding said middle stage have sequentially increasing variable low pass cutoff frequencies.

5. The electrical signal filter device of claim 4 wherein respective stages of said N serially coupled clock driven filter stages succeeding said middle stage have variable low pass cutoff frequencies equivalent to respective complementary stages of said N serially coupled clock driven filter stages preceding said middle stage.

6. The electrical signal filter device of claim 1 wherein said clock means comprises a single clock source and at least one frequency divider circuit.

7. The electrical signal filter device of claim 1 wherein said clock means comprises a plurality of clock sources.

8. A method of filtering frequency components of an electrical signal above a selectable low pass cutoff frequency changeable within a designated range, said method comprising the steps of:
(a) applying said electrical signal to a low pass input filter having a first fixed low pass cutoff frequency greater than an upper limit frequency of said designated range;
(b) applying an output of said low pass input filter to at least three serially coupled clock driven filter stages respectively having a variable low pass cutoff frequency proportional to a clock rate of a respective clock signal received applied thereto;
(c) adjusting the clock rate of said respective clock signal received as an input to a first stage of said at least three serially coupled clock driven filter stages to a frequency greater than twice said first fixed low pass cutoff frequency such that a first variable low pass cutoff frequency thereof is equal to said upper limit frequency of said designated range
(d) adjusting the clock rate of said respective clock signal received as an input to a second stage of said at least three serially coupled clock driven filter stages to a frequency greater than twice the variable low pass cutoff frequency of an immediately preceding stage of said clock driven filter stages such that a second variable cutoff frequency thereof is equal to said selectable low pass cutoff frequency; and,
(e) adjusting the clock rate of said respective clock signal received as an input to a third stage of said at least three serially coupled clock driven filter stages such that a third variable cutoff frequency thereof is greater than said selectable low pass cutoff frequency and less than the clock rate of the respective clock signal applied to an immediately preceding stage.

9. The method of claim 8 further comprising the step of (f) applying an output of said third stage to a low pass output filter having a second fixed low pass cutoff frequency greater than said upper limit frequency of said designated range and less than the clock rate of the respective clock signal applied to said third stage.

* * * * *